United States Patent
Warner et al.

(10) Patent No.: US 8,581,246 B2
(45) Date of Patent: Nov. 12, 2013

(54) PROTECTIVE BARRIERS FOR ELECTRONIC DEVICES

(75) Inventors: John C. Warner, Wilmington, MA (US); Michael S. Viola, Burlington, MA (US)

(73) Assignee: Warner Babcock Institute for Green Chemistry, Wilmington, MA (US)

( * ) Notice: Subject to any disclaimer, the term of this patent is extended or adjusted under 35 U.S.C. 154(b) by 146 days.

(21) Appl. No.: 13/224,674

(22) Filed: Sep. 2, 2011

(65) Prior Publication Data

US 2013/0056723 A1    Mar. 7, 2013

(51) Int. Cl.
*H01L 29/10* (2006.01)
*H01L 29/12* (2006.01)

(52) U.S. Cl.
USPC ........................................................ 257/43

(58) Field of Classification Search
USPC .................. 257/449, 40, 98, 642–643, 759, 257/E39.007, E51.001–E51.052, 257/E27.117–E27.119; 438/82, 99, 29, 69, 438/28
See application file for complete search history.

(56) References Cited

U.S. PATENT DOCUMENTS

| | | | |
|---|---|---|---|
| 2006/0063072 A1* | 3/2006 | Li et al. ........................ | 429/245 |
| 2011/0233532 A1* | 9/2011 | Sotzing et al. ................ | 257/40 |

* cited by examiner

*Primary Examiner* — Dao H Nguyen
*Assistant Examiner* — Tram H Nguyen
(74) *Attorney, Agent, or Firm* — James G Shelout; The Patent Practice of Szmanda & Shelnut LLC

(57) ABSTRACT

The present disclosure provides for electronic devices that use low cost, conductive materials as transparent conductors. The devices contain corrosion preventative conductive polymer layers and conductive innerlayer barriers that separate corrosive electrolyte from the conductors which are prone to corrosion and dissolution, while providing an uninterrupted electrical circuit. The present disclosure also allows for the use of layers which have been applied from aqueous media thereby reducing both the cost and the environmental impact of the electronic devices. Methods of manufacture are also provided.

29 Claims, 1 Drawing Sheet

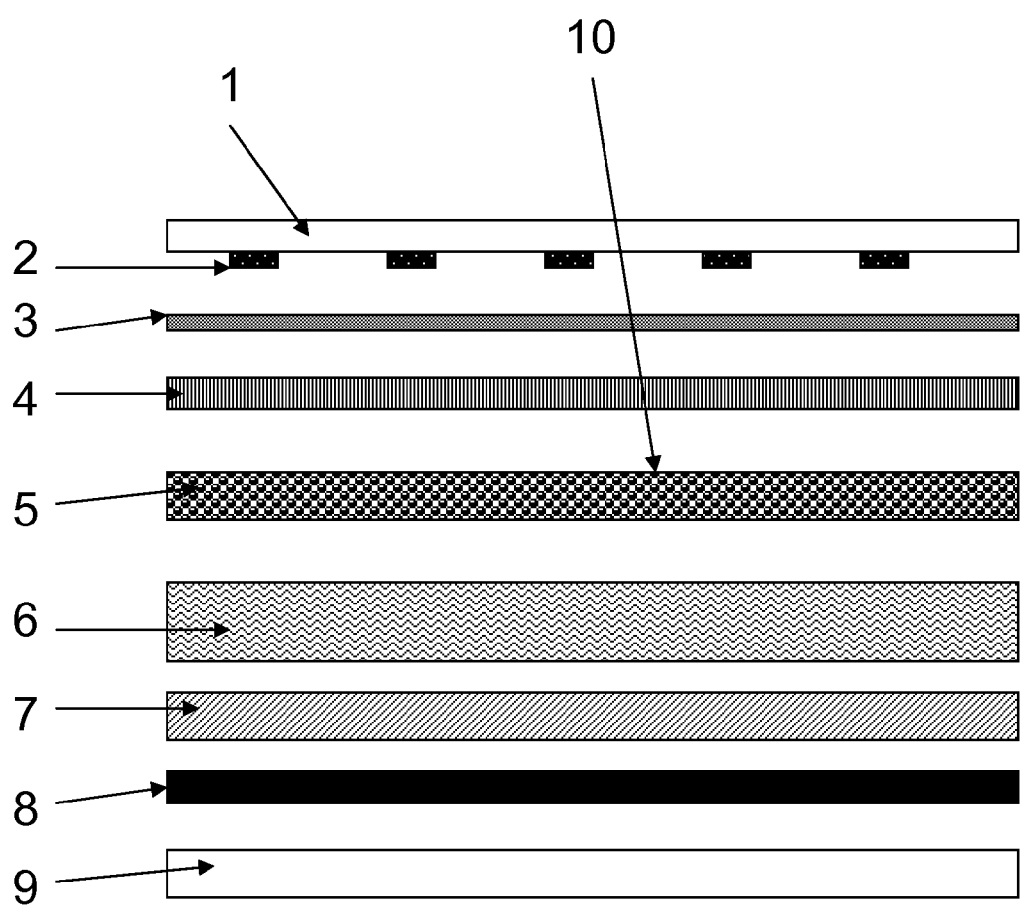

US 8,581,246 B2

PROTECTIVE BARRIERS FOR ELECTRONIC DEVICES

FIELD OF INVENTION

The present disclosure is in the field of electronic devices, more particularly in the field of protective barriers for electronic devices that contain corrosive materials in their structure.

BACKGROUND

Indium tin oxide (ITO) is extensively used as material for transparent electrodes in such applications as liquid crystal displays, organic light emitting diodes, touch panels, electronic paper, plasma display devices and solar cells. Because ITO has limited flexibility, is costly, has limited transmittance and is applied by such techniques as physical vapor deposition, electron beam evaporation or sputter deposition techniques, new materials are being sought to replace ITO particularly in flexible, low cost applications.

Many elegant attempts at a solution to this problem have been put forth including carbon nanotubes conductive coatings, films of graphene, aluminum, gallium or indium doped zinc oxide, and inherently conductive polymers. While each improves one or more issues, each presents its own set of problems and challenges. For example, fabricating conductive lines and matrices with conductive polymers is difficult.

One approach to replacing ITO is to provide silver thin films which provide excellent conductivity and transparency, flexibility, are readily available and can be coated by a number of cost-effect techniques including printing techniques such as lithography, inkjet printing, screen printing and letterpress.

Some electronic devices, including batteries and electrochemical solar cells, including dye sensitized solar cells, contain liquid electrolyte materials which in many cases can be extremely corrosive to metals used as electrodes for the devices. Some metals and metal alloys, such as Ti foil or ITO, respectively, are not corroded by liquid electrolytes, but ITO replacement materials generally are susceptible to such attack. As a result adoption of non-ITO materials has been restrained in these applications due to the incompatibility of corrosion sensitive materials used as electrodes and the corrosive liquid electrolyte materials.

For example, in dye-sensitized solar cells, a dye is used to absorb light and initiate a rapid electron transfer to a nanostructured, nanoporous oxide film such as anatase $TiO_2$ which in turn transfers the electron to a non-ITO metal conductor attached to a substrate. Charge balance and transport is achieved by an electrolyte layer having a redox couple such as iodide/triiodide (PIO in a liquid carrier such as acetonitrile. The electrolyte is corrosive and can permeate the nanoporous oxide to attack and/or dissolve the non-ITO metal conductor.

Additionally, many of the processes used in the manufacturing of electronic devices, such as solar cells, use highly toxic materials as well as high VOC coatings which add to the cost and place an unhealthy demand on the environment.

As can be readily seen, there is a need for low cost materials for electronic devices which allows for flexibility, cost reduction and ease of manufacture, while at the same time eliminating the problem of liquid electrolyte attack on the conductive metal. Additionally there is an unmet need to reduce environmental pollutants and the use of toxic materials in the manufacture of electronic devices such as photovoltaic solar cells.

BRIEF DESCRIPTION OF THE DRAWINGS

FIG. 1 shows an expanded view of a photovoltaic cell.

SUMMARY OF THE INVENTION

The present disclosure allows for the use of low cost, conductive materials as conductors and metal oxides as semiconductors in electronic devices such as photovoltaic cells by providing conductive polymer layers and conductive innerlayers for corrosion resistance. The aforesaid layers separate corrosive electrolyte from the conductors which are prone to corrosion and dissolution, while providing an uninterrupted electrical circuit. By allowing the use of low cost, conductive materials as conductors the use of costly ITO can be eliminated in these devices. The present disclosure also allows for the use of layers which have been applied from aqueous media thereby reducing both the cost and the environmental impact of electronic device manufacture.

In a first embodiment, the present application for patent discloses and claims an electronic device that contains a conductor on a substrate, a conductive polymer layer adjacent to the conductor, a conductive innerlayer, and an electrolyte. The conductive innerlayer separates the conductive polymer layer from the electrolyte. A semiconductor material such as a metal oxide or a dye sensitized metal oxide may be situated between the conductive innerlayer and the electrolyte. The conductive polymer and conductive innerlayer are deposited from aqueous based media.

In a second embodiment, the present application for patent discloses and claims a method of providing an electronic device comprising providing a conductor on a substrate, applying a conductive polymer layer to the conductor, applying a conductive innerlayer, and applying an electrolyte layer. The conductive innerlayer separates the conductive polymer layer from the electrolyte. A semiconductor material such as a metal oxide or a dye sensitized metal oxide may be applied between the conductive innerlayer and the electrolyte. The conductive polymer and conductive innerlayer are deposited from aqueous based media.

In further embodiments the conductive polymer of the above embodiments are water soluble or dispersible. The conductive innerlayer is prepared from water soluble or dispersible materials.

DETAILED DESCRIPTION OF THE INVENTION

As used herein, the conjunction "or" is not intended to be exclusive unless otherwise noted. For example, the phrase "or alternatively" is intended to be exclusive. Further, when used in connection with chemical substitution at a specific position, the conjunction "or" is intended to be exclusive As used herein the phrase substantially free of solvent means less than 5% solvent.

As used herein the term conductor refers to a material that conducts electricity and can be in the form of a layer, a matrix of lines, or other configurations.

For illustrative purposes of the current disclosure we will use a photovoltaic cell as an example. While not to be restricted to only photovoltaic cells the current disclosure can be utilized in any electronic device where corrosion is an issue. Referring now to the expanded view of a representative electronic device of the present disclosure, here a photovoltaic cell, as shown in FIG. 1, are a substrate 1, a conductor 2, an anti-corrosive layer of conductive polymer 3, a conductive innerlayer 4, a photoreactive layer 5, a redox electrolyte 6, a second conductive innerlayer 7, a second conductor 8, and a second substrate 9.

The substrate 1 can be any of a number of materials which allows light energy 10 to pass through it, such as, for example, any of a number of silicon based glasses, transparent polymer films such as polyethylene terephthalate, polypropylene, polystyrene, and the like. The more useful materials will have the higher transparency to the wavelength of interest in the photovoltaic cell, but lower transparency will also function.

The conductor 2 may be any non-ITO material such as, for example, silver, copper, and carbon based conductive material such as carbon nanotubes, graphene, carbon black, conductive polymers and the like. Generally, a material used as the conductor in a photovoltaic cell has at least partial transparency to the wavelength spectrum of interest in the photovoltaic cell. Many materials, such as, for example, silver can be coated thin enough to provide good transparency while still maintaining good conductivity. Conductor precursors may also be used in which a conductive precursor composition is applied followed by a step which converts the precursor into a conductive material. The conductor may be coated onto the substrate by number of coating method as a full layer of conductor followed by a patterning step, such a photoresist print-and-etch process, which generates a matrix of conductive lines depending on the design of the photovoltaic cell. One method of applying the conductor or conductor precursor includes printing of conductive lines using lithography such as letterpress or ink jet printing. These methods allow the generation of conductive lines directly onto the substrate thereby eliminating laborious and costly patterning steps.

Since the conductor 2 is subject to attack by a number of corrosive materials, such as redox electrolyte materials 6, the conductor 2 is covered by a conductive anti-corrosion layer 3. Materials suitable as anti-corrosion, conductive materials include, for example, inherently conductive polymers such as, for example the polythiophenes, such as, for example, poly(3,4-ethylenedioxythiophene), the polyanilines, the polypyrroles, polyacetylenes, polyphenylene vinylene, and poly-p-phenylene sulfide, and mixtures thereof, many of which have been oxidized to improve their conductivity and/or reacted with other materials to improve one or more of their other properties. For example, (3,4-ethylenedioxythiophene) may be reacted with p-toluene sulfonic acid or polystyrene sulfonic acid to increase its compatibility with water, including solubility. Other anti-corrosion, conductive materials may include, for example, carbon base conductive material such as, for example, graphene, carbon black and carbon nanoparticles such as nanotubes. A number of materials can be used to protect the conductor 2 from corrosion, however, since there is a strong desire to reduce the use of potential pollutants and the use of potentially toxic materials such as solvents, the anticorrosion, conductive materials that are water soluble or dispersible can be used, such as, for example, polystyrene sulfonic acid-poly-(3,4-ethylenedioxythiophene) and p-toluene sulfonic acid-polypyrrole. As mentioned above any material that is used as the anti-corrosive, conductive material should have at least partial transparency to the wavelength of interest in the photovoltaic cell.

The conductive innerlayer 4, further protects the conductor 2, from corrosion by the electrolyte 6. A number of polymeric materials can be used as coating media for the conductive innerlayer, such as, for example, polyethylene, polypropylene, polystyrene, polyvinyl chloride, poly-4-vinyl pyridine, polyvinyl alcohol, polyhydroxyethyl methacrylate and copolymers thereof, or any of the class of polyacrylates including polymethylmethacrylate, cellulosic materials, polyethylene terephthalate, and the like and mixtures thereof. These materials are generally transparent in the wavelength spectrum of interest. Since many polymeric materials are not inherently conductive, the polymeric materials are admixed with one or more conductive material, such as, for example, any of the conductive polymers described supra. If the polymeric material of the innerlayer is itself inherently conductive, then one or more conductive polymers may optionally be added. Again since there is a strong desire to reduce the use of potential pollutants and the use of potentially toxic materials, conductive innerlayers which are applied from water-based compositions can be used. Examples of such coating compositions include polyvinyl alcohol admixed with polystyrene sulfonic acid-poly-(3,4-ethylenedioxythiophene) in water.

The conductive innerlayer may further contain selective additives that aid in barrier properties, anti corrosive properties, stability, wetting, leveling and other useful properties. For example, selected natural or synthetic clays may be added to improve the barrier properties of the conductive innerlayer.

The photoreactive material 5, can be a metal oxide, such as mesoporous titanium dioxide, tungsten oxide, tin oxide, zinc oxide or other known semiconductor oxides, and mixtures thereof. When in contact with a sensitizing dye, these materials act as an anode when light of the desired wavelength spectrum impinges on it. When in contact with the redox electrolyte 6, and a second conductor 8, a semiconductor is formed.

The redox electrolyte 6, may be a gel that contains a redox couple such as $I_3^-/I^-$, $Co^{+++}/Co^{++}$, $Fe^{+++}/Fe^{++}$, $Cu^{++}/Cu^+$, $Ag^+/Ag$, tetrazoles/disulphides or ferrocinium/ferrocene in liquid, gel or solid solution form. The second conductor 8, may be composed of the same material as conductor 2 and may be patterned the same or different, or it may contain other conductive materials such as, for example, platinum, palladium, silver, copper and the like. A second conductive innerlayer 7, may also be present to separate the redox electrolyte 6, from the second conductor 8, and can be the same or different from the conductive layer 4. A second substrate 9, is also present and may be the same or different than substrate 1. The electrolyte 6, the second conductive layer 7, the second conductor 8 and the second support 9 do not need to be transparent to light since the light used by the photovoltaic cell passes through layers 1-4 and is captured by the photoreactive layer 5.

In operation, for the exemplary photovoltaic cell, light passes through substrate 1, conductor 2, the conductive polymer 3 and the conductive innerlayer 4 into the photoreactive layer 5, where it can excite electrons that then flow through the conductive innerlayer 4 and the conductive polymer 3, to be collected by the conductor 2. Note that the conductive polymer allows improved electron flow to the conductor than cells that do not contain conductive polymer between the photoreactive material and the conductor. After flowing through the external circuit, they are re-introduced into the photovoltaic cell through the second conductor flowing into the electrolyte. The electrolyte then transports the electrons back to the photoreactive layer.

Since the photoreactive materials are generally porous materials and since they are situated adjacent to the electrolyte, they can allow the electrolyte to seep through. If the conductive innerlayer and the anti-corrosion conductive polymer were absent, the electrolyte can potentially corrode the conductor thus rendering the photovoltaic cell useless.

The instant disclosure also provides for methods of construction of photovoltaic cells. One method includes application of the conductor 2 to the substrate 1 using conductive pastes, such as silver paste, which have been applied by a patterning method such as, for example, inkjet printing or lithographic processes such as letterpress, screen printing or offset lithography. The substrate 1 may be glass or polymeric film. Drying removes any volatile materials.

The conductive polymer 3 can be a water soluble material such as for example polystyrene sulfonic acid-poly-(3,4-ethylenedioxythiophene) or water dispersible such as colloidal p-toluene sulfonic acid-polypyrrole. The conductive polymer admixes may be applied by many methods known in the art, such as for example, spraying, slot coating, curtain coating, brushing, roller coating, spin coating and the like. Water is then removed by drying.

The conductive innerlayer 4 can be any of a number of water soluble or dispersible materials such as, for example, polyvinyl alcohol which has been doped with water compatible conductive materials which may be the same or different from the conductive polymers 3. The thus formulated conductive innerlayer admixes may be applied by many methods known in the art, such as for example, spraying, slot coating, curtain coating, brushing, roller coating, spin coating and the like. Water is then removed by drying.

The photoreactive material 5 is then applied to the conductive innerlayer. This may be applied as a water-based slurry of $TiO_2$ or other photoreactive metal oxide. The slurry may be applied by many methods known in the art, such as for example, spraying, slot coating, curtain coating, brushing, roller coating, spin coating and the like. Water is then removed by drying.

A second substrate 9 is coated with a second conductor 8 such as platinum or other conductive materials, either of which does not need to be transparent to light which is useful for the photovoltaic cell. A second conductive innerlayer 7 is applied which may be the same as conductive innerlayer 4 and coated out of water or it may be different. The electrolyte such as iodide is then applied.

The two substrates are then joined and sealed together to prevent the electrolyte from leaking.

Example

A 4 mil transparent polyethylene terephthalate substrate (DuPont 454) was printed with silver grid lines using a silver ink made by PChem Associates (Bensalem, Pa.). Printing was performed using an offset press to produce silver lines with a width of 25 microns, a height of 0.6 to 0.8 microns and spacing between the lines of 1500 microns.

The grids were coated with Orgacon™ S-300, 0.7 wt % of polystyrene sulfonic acid-poly-(3,4-ethylenedioxythiophene) in water, from Agfa Gevaert, using a #16 Meyer bar and dried at room temperature for 15 min followed by 10 min at 100° C.

Next a composition of 95 wt % polyvinyl alcohol (various grades as listed below) and 5 wt % Orgacon™ S-300 was applied using a #16 Meyer bar and dried at room temperature for 15 min followed by 10 min at 100° C. to achieve a thickness of about 2 microns. The coatings were transparent with a slight bluish/grey tint to them.

The following grades of PVA were used for these tests and were made as a standard 10 wt % stock solution:

| Experiment | Molecular weight | Degree of hydrolysis |
| --- | --- | --- |
| 1 | 85-124K | 98-99 |
| 2 | 146-186K | 98-99 |
| 3 | 86K | 99-100 |
| 4 | 89-98K | 99+ |
| 5 | 146-186K | 99+ |

To prepare these fluids, each PVA was first dispersed in water and then dissolved at 95° C. until a clear solution was obtained. The appropriate amounts of PVA and Orgacon™ S-300 were then mixed at room temperature to achieve the desired ratio of 95/5 PVA/S-300 wt/wt.

A small sample of each construction (approximately 4 mm×10 mm) was placed into a 2 ml glass vial and the vial was then filled with an iodide based electrolyte (Iodolyte from Solaronix in Switzerland). The sample was maintained at room temperature throughout the test period. On a daily basis each sample was examined, without removing from the fluid, by looking through the glass vial at low magnification (25×). A visual observation was made as to the state of the silver lines and the degree of corrosion was quantified.

In the absence of the protective layer, the silver grid line is observed to completely corrode away within 10 seconds. For the samples with the protective layers the silver grid lines did not appear to be attached after 20 days in the Iodolyte.

We claim:

1. An electronic device comprising:
    a. a conductor on a substrate;
    b. a conductive polymer layer adjacent to the conductor;
    c. a conductive innerlayer; and
    d. an electrolyte;
        wherein the conductive innerlayer separates the conductive polymer layer from the electrolyte.
2. The device of claim 1, further comprising a semiconductor layer between the conductive innerlayer and the electrolyte.
3. The device of claim 1, wherein the device is a photovoltaic cell or a battery.
4. The device of claim 1, wherein the conductive polymer layer protects the conductor from corrosion by the electrolyte.
5. The device of claim 4, wherein the conductive polymer is an organic conductive layer.
6. The device of claim 5, wherein the conductive polymer is a poly(3,4-ethylenedioxythiophene).
7. The device of claim 1, wherein the conductor is a patterned conductive metal.
8. The device of claim 2, wherein the semiconductor is a metal oxide.
9. The device of claim 8, wherein the metal oxide is chosen from titanium dioxide, zinc oxide, tungsten oxide, tin dioxide and mixtures thereof.
10. The device of claim 1, wherein the conductive polymer has been applied from an aqueous medium which is substantially free of organic solvents, cosolvents and diluents.
11. The device of claim 1, wherein the conductive innerlayer has been applied from an aqueous medium which is substantially free of organic solvents, cosolvents and diluents.
12. The device of claim 11, wherein the conductive innerlayer comprises an aqueous admixture of a coating polymer and a conductive polymer.
13. The device of claim 12, wherein the coating polymer is polyvinyl alcohol.
14. The device of claim 12, wherein the conductive polymer is a poly(3,4-ethyleneoxythiophene).
15. A method of providing an electronic device comprising:

a. providing a conductor on a substrate;
b. applying a conductive polymer layer to the conductor;
c. applying a conductive innerlayer; and
d. applying an electrolyte layer;
   wherein the conductive interlayer is applied in such a manner that it separates the conductive polymer layer from the electrolyte.

16. The method of claim 15, further comprising applying a semiconductor between the conductive innerlayer and the electrolyte.

17. The method of claim 15, wherein the electronic device is a photovoltaic cell or a battery.

18. The method of claim 15, wherein the conductive polymer layer protects the conductor from corrosion by the electrolyte.

19. The method of claim 18, wherein the conductive polymer is an organic conductive layer.

20. The method of claim 19, wherein the conductive polymer is a poly(3,4-ethylenedioxythiophene).

21. The method of claim 15, wherein the conductor is a patterned conductive metal.

22. The method of claim 16, wherein the semiconductor is a metal oxide.

23. The method of claim 22, wherein the metal oxide is chosen from titanium dioxide, zinc oxide, tungsten oxide, tin dioxide and mixtures thereof.

24. The method of claim 15, wherein the conductive polymer has been applied from an aqueous medium which is substantially free of organic solvents cosolvents or diluents.

25. The method of claim 15, wherein the conductive innerlayer has been applied from an aqueous medium which is substantially free of organic solvents, cosolvents or diluents.

26. The method of claim 25, wherein the conductive innerlayer comprises an aqueous admixture of a coating polymer and a conductive polymer.

27. The method of claim 26, wherein the coating polymer is polyvinyl alcohol.

28. The method of claim 26, wherein the conductive polymer is a poly(3,4-ethyleneoxythiophene).

29. An electronic device comprising any one of the photovoltaic cells in claims 1-14.

* * * * *